United States Patent
Emoto et al.

(10) Patent No.: US 12,255,061 B2
(45) Date of Patent: Mar. 18, 2025

(54) SUBSTRATE PROCESSING METHOD (71) Applicant: SCREEN Holdings Co., Ltd., Kyoto (JP)

(72) Inventors: Tetsuya Emoto, Kyoto (JP); Shigeru Yamamoto, Kyoto (JP); Daiki Fujii, Kyoto (JP); Kenji Edamitsu, Kyoto (JP); Keiji Iwata, Kyoto (JP); Yuya Kawai, Kyoto (JP); Kenichi Ito, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 55 days.

(21) Appl. No.: 18/007,267

(22) PCT Filed: Jun. 22, 2021

(86) PCT No.: PCT/JP2021/023609
§ 371 (c)(1),
(2) Date: Jan. 27, 2023

(87) PCT Pub. No.: WO2022/024590
PCT Pub. Date: Feb. 3, 2022

(65) Prior Publication Data
US 2023/0290631 A1     Sep. 14, 2023

(30) Foreign Application Priority Data

Jul. 31, 2020     (JP) ................................ 2020-130881

(51) Int. Cl.
*B08B 3/08*     (2006.01)
*H01L 21/02*     (2006.01)

(52) U.S. Cl.
CPC .......... *H01L 21/02057* (2013.01); *B08B 3/08* (2013.01)

(58) Field of Classification Search
CPC ....................................................... B08B 3/08
See application file for complete search history.

(56) References Cited

U.S. PATENT DOCUMENTS

| | | | |
|---|---|---|---|
| 7,749,909 B2 | 7/2010 | Tomita et al. | 438/694 |
| 7,838,425 B2 | 11/2010 | Tomita et al. | 438/690 |

(Continued)

FOREIGN PATENT DOCUMENTS

| | | |
|---|---|---|
| JP | 2010-114467 A | 5/2010 |
| JP | 2011-124410 A | 6/2011 |

(Continued)

OTHER PUBLICATIONS

Office Action dated Mar. 20, 2024 issued in corresponding Korean Patent Application No. 10-2023-7004564.

(Continued)

*Primary Examiner* — Austin Murata
(74) *Attorney, Agent, or Firm* — OSTROLENK FABER LLP (57) ABSTRACT

A substrate processing method is provided. The substrate processing method includes: (S7) supplying a water repellent agent (SMT) to a substrate (W); (S11) supplying dilute isopropyl alcohol (dIPA) to the substrate (W) after the supplying a water repellent agent (SMT), the dilute isopropyl alcohol (dIPA) being obtained by diluting isopropyl alcohol; and (S12) drying the substrate (W) after the supplying dilute isopropyl alcohol (dIPA).

4 Claims, 6 Drawing Sheets

(56) References Cited

U.S. PATENT DOCUMENTS

| | | | |
|---|---|---|---|
| 7,985,683 B2 | 7/2011 | Tomita et al. | 438/694 |
| 9,859,111 B2 | 1/2018 | Ogawa et al. | |
| 9,991,111 B2 | 6/2018 | Ogawa et al. | |
| 10,903,092 B2 | 1/2021 | Nakai et al. | |
| 2009/0311874 A1 | 12/2009 | Tomita et al. | 438/759 |
| 2010/0075504 A1 | 3/2010 | Tomita et al. | 438/706 |
| 2010/0240219 A1 | 9/2010 | Tomita et al. | 438/706 |
| 2011/0143541 A1* | 6/2011 | Ogawa | H01L 21/67028 438/694 |
| 2015/0034130 A1 | 2/2015 | Koide et al. | 134/26 |
| 2016/0049289 A1 | 2/2016 | Ogawa et al. | |
| 2018/0082832 A1 | 3/2018 | Ogawa et al. | |
| 2019/0027383 A1* | 1/2019 | Nakai | H01L 21/68714 |

FOREIGN PATENT DOCUMENTS

| | | |
|---|---|---|
| JP | 2014-064032 A | 4/2014 |
| JP | 2019-046856 A | 3/2019 |
| KR | 10-2018-0099864 A | 9/2018 |
| WO | WO2017/159052 A1 | 9/2017 |

OTHER PUBLICATIONS

International Search Report mailed Aug. 31, 2021 in corresponding PCT International Application No. PCT/JP2021/023609.

\* cited by examiner

SUBSTRATE PROCESSING METHOD

CROSS-REFERENCE TO RELATED APPLICATIONS

The present application is a 35 U.S.C. § 371 national stage application of International Application No. PCT/JP2021/023609, filed Jun. 22, 2021, which claims priority to Japanese Patent Application No. 2020-130881, filed Jul. 31, 2020, the contents of which are incorporated herein by reference.

TECHNICAL FIELD

The present invention relates to a substrate processing method.

BACKGROUND ART

As one type of methods for processing a substrate, there are substrate processing methods in which a residue remaining on the substrate after pattern formation by ashing or etching is removed. Among the substrate processing methods, a method is known in which chemical liquid processing, rinsing processing, and spin drying processing are performed sequentially on a substrate. In the rinsing processing, water is supplied to the substrate to remove a chemical liquid from the upper surface of the substrate.

However, in a case in which a micropattern is formed in a surface portion of the substrate, water entering inside the micropattern may not be removed by the spin drying processing. When the water entering inside the micropattern cannot be removed due to water being a liquid with high surface tension, the micropattern may collapse due to the presence of the water entering inside the micropattern.

In view of the foregoing, the micropattern may be covered with a water repellent protection film by supplying a water repellent agent to the substrate in order to prevent micropattern collapse. For example, Patent Literature 1 discloses a substrate processing method in which chemical liquid processing, pure water rinsing processing, water repellent processing, pure water rinsing processing, and drying processing are sequentially performed on a substrate.

Specifically, pure water is supplied to the substrate to remove a chemical liquid from the upper surface of the substrate in the pure water rinsing processing after the chemical liquid processing. In the water repellent processing, a water repellent agent is supplied to the substrate to form a water repellent protection film covering a pattern. In the pure water rinsing processing after the water repellent processing, pure water is supplied to the substrate to remove the water repellent agent remaining on the upper surface of the substrate.

CITATION LIST

Patent Literature

Patent Literature 1: Japanese Patent Application Laid-Open Publication No. 2010-114467

SUMMARY OF INVENTION

Technical Problem

However, water is hard to spread over the entirety of the upper surface of the substrate. As such, an area not covered with the pure water may remain in the upper surface of the substrate. Therefore, supply of pure water only may reduce the removal rate of the water repellent agent (residue of the water repellent agent) remaining on the upper surface of the substrate, leading to a decrease in cleanliness of the substrate.

The present invention has been made in view of the foregoing and has its object of providing a substrate processing method that can increase cleanliness of a substrate.

Solution to Problem

According to an aspect of the present invention, a substrate processing method is a method for processing a substrate including: supplying a water repellent agent to the substrate; supplying dilute isopropyl alcohol to the substrate after the supplying a water repellent agent, the dilute isopropyl alcohol being obtained by diluting isopropyl alcohol; and drying the substrate after the supplying dilute isopropyl alcohol.

In one embodiment, the substrate processing method further includes supplying isopropyl alcohol to the substrate before the supplying a water repellent agent.

In one embodiment, the substrate processing method further includes supplying isopropyl alcohol to the substrate after the supplying dilute isopropyl alcohol and before the drying the substrate.

In one embodiment, the substrate processing method further includes supplying isopropyl alcohol to the substrate after the supplying a water repellent agent and before the supplying dilute isopropyl alcohol.

Advantageous Effects of Invention

According to the substrate processing method of the present invention, cleanliness of a substrate can be improved.

DESCRIPTION OF EMBODIMENTS

The following describes embodiments of a substrate processing method of the present invention with reference to the accompanying drawings (FIGS. 1 to 6). However, the present invention is no way limited to the following embodiments. Where explanation overlaps, the explanation may be omitted as appropriate. Furthermore, elements that are the same or equivalent are indicated by the same reference signs in the drawings and description thereof is not repeated.

Various substrates are applicable to a "substrate" in the embodiments, such as a semiconductor wafer, a glass substrate for photomask use, a glass substrate for liquid crystal display use, a glass substrate for plasma display use, a substrate for field emission display (FED) use, a substrate for optical disc use, a substrate for magnetic disc use, and a substrate for magneto-optical disc use. Although the embodiments will be described below mainly using a substrate processing method for processing a disc-shaped semiconductor wafer as an example, the method is likewise applicable to processing of various substrates listed above. Furthermore, various shapes are also employable to the substrate.

First Embodiment

Figure 1:
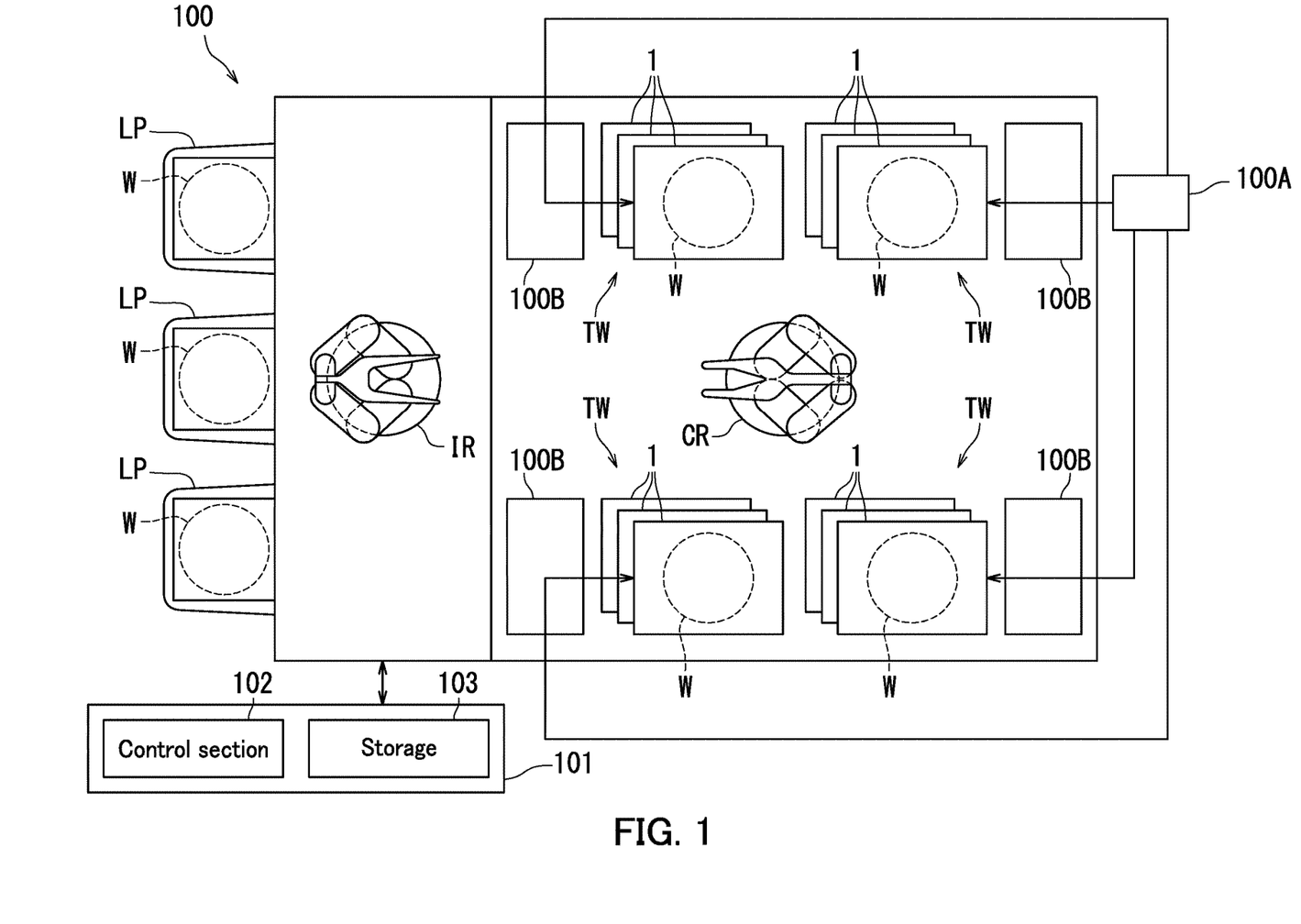
FIG. 1 is a schematic diagram of a substrate processing apparatus used in a substrate processing method according to a first embodiment of the present invention.
Figure 2:
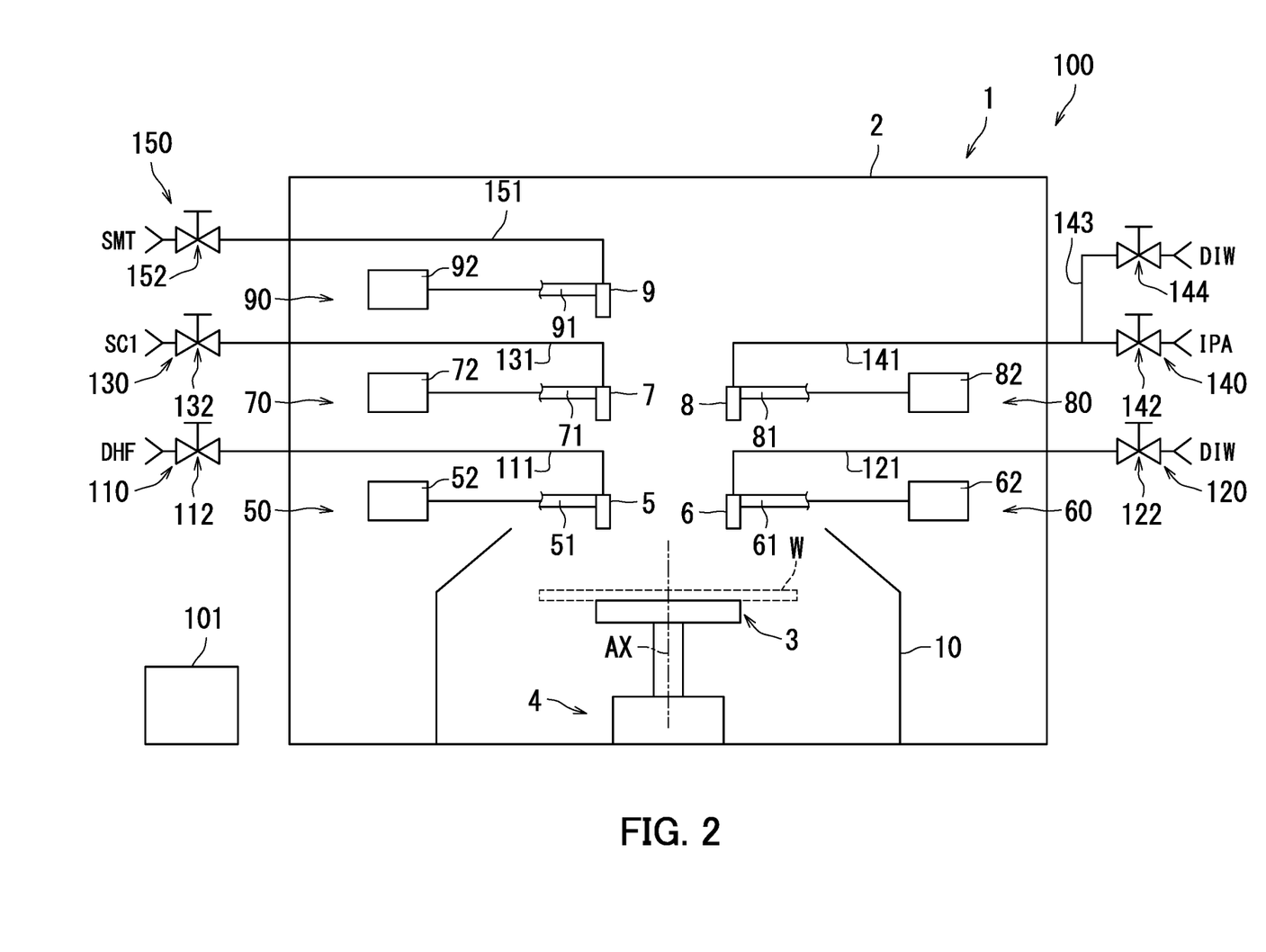
FIG. 2 is a schematic diagram of a processing unit included in the substrate processing apparatus.
Figure 3:
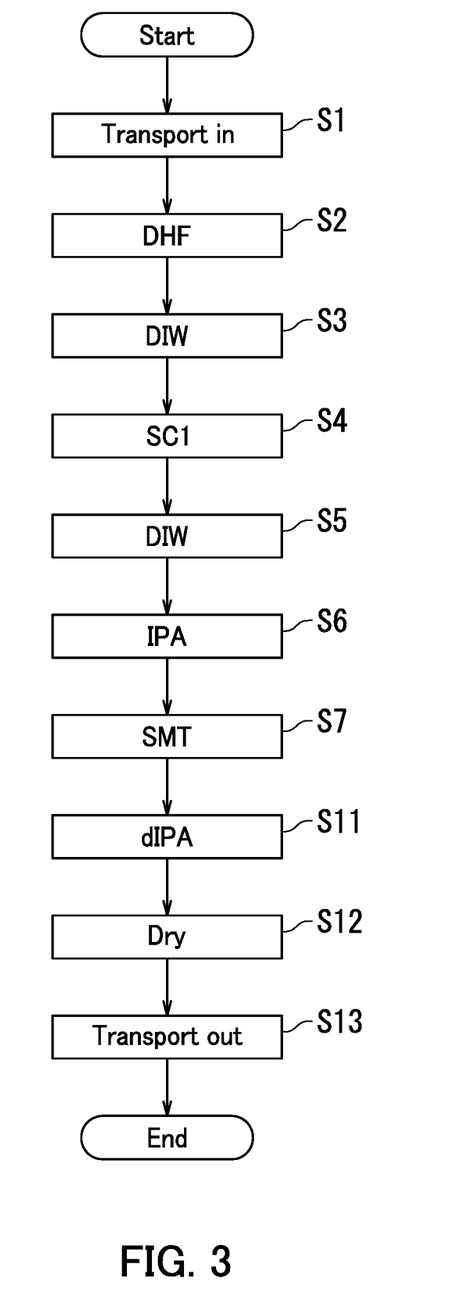
FIG. 3 is a flowchart depicting the substrate processing method according to the first embodiment of the present invention.

The following describes a first embodiment of the present invention with reference to FIGS. 1 to 3. First of all, a substrate processing apparatus 100 will be described with reference to FIG. 1. FIG. 1 is a schematic diagram of the substrate processing apparatus 100 used in a substrate processing method of the present embodiment. Specifically, FIG. 1 is a schematic plan view of the substrate processing apparatus 100. The substrate processing apparatus 100 processes substrates W. More specifically, the substrate processing apparatus 100 is an apparatus of single-wafer type that processes substrates W one at a time. The substrate processing method of the present embodiment can be implemented by the substrate processing apparatus 100, for example.

As illustrated in FIG. 1, the substrate processing apparatus 100 includes a plurality of processing units 1, a fluid cabinet 100A, a plurality of fluid boxes 100B, a plurality of load ports LP, an indexer robot IR, a center robot CR, and a controller 101.

Each of the load ports LP accommodates a plurality of substrates W in a stacked manner. The indexer robot IR transports the substrates W between the load ports LP and the center robot CR. The center robot CR transports the substrates W between the indexer robot IR and the processing units 1. It is possible that a loading table (path) on which the substrates W are temporarily placed is provided between the indexer robot IR and the center robot CR to constitute an apparatus configuration in which the substrates W are indirectly delivered between the indexer robot IR and the center robot CR via the loading table.

The processing units 1 form a plurality of towers TW (4 tours in FIG. 1) arranged so as to surround the center robot CR in a plan view. Each of the towers TW includes a plurality of vertically stacked processing units 1 (3 processing units in FIG. 1). Each of the processing units 1 processes a substrate W by supplying processing liquids to the substrate W.

The fluid cabinet 100A contains the processing liquids. The fluid boxes 100B each correspond to one of the towers TW. The processing liquids in the fluid cabinet 100A are supplied via one of the fluid boxes 100B to all the processing units 1 included in one of the towers TW that corresponds to the one of the fluid boxes 100B.

The processing liquids in the present embodiment include dilute hydrofluoric acid (DHF), deionized water (DIW), a standard clean 1 (SC1, a mixed liquid of ammonia water, hydrogen peroxide, and water), isopropyl alcohol (IPA), and a water repellent agent SMT.

The controller 101 will be described next. The controller 101 controls operation of each element of the substrate processing apparatus 100. For example, the controller 101 controls the load ports LP, the indexer robot IR, and the center robot CR. The controller 101 includes a control section 102 and storage 103.

The control section 102 includes a processor. The control section 102 includes a central processing unit (CPU) or a microprocessing unit (MPU), for example. Alternatively, the control section 102 may include a general-purpose computer.

The storage 103 stores data and computer programs therein. The data includes recipe data. The recipe data contains information indicating a plurality of recipes. The recipes each define processing details and a procedure for processing a substrate W.

The storage 103 includes a main storage device. The main storage device is semiconductor memory, for example. The storage 103 may further include an auxiliary storage device. The auxiliary storage device includes at least one of semiconductor memory and a hard disk drive, for example. The storage 103 may include a removable medium. The control section 102 controls operation of each element of the substrate processing apparatus 100 based on the computer programs and the data stored in the storage 103.

The substrate processing apparatus 100 will be further described next with reference to FIGS. 1 and 2. FIG. 2 is a schematic diagram of a processing unit 1 of the substrate processing apparatus 100. In detail, FIG. 2 is a schematic cross-sectional view of the processing unit 1.

As illustrated in FIG. 2, the processing unit 1 includes a chamber 2, a substrate holding section 3, a rotary drive section 4, first to fifth nozzles 5 to 9, a cup 10, first to fifth nozzle moving sections 50 to 90. The substrate processing apparatus 100 further includes first to fifth processing liquid supply sections 110 to 150. The controller 101 (control section 102) controls the substrate holding section 3, the rotary drive section 4, the cup 10, the first to fifth nozzle moving sections 50 to 90, and the first to fifth processing liquid supply sections 110 to 150.

The chamber 2 is substantially box-shaped. The chamber 2 accommodates a substrate W, the substrate holding section 3, the rotary drive section 4, the first to fifth nozzles 5 to 9, the cup 10, and the first to fifth nozzle moving sections 50 to 90. The chamber 2 further accommodates respective parts of the first to fifth processing liquid supply sections 110 to 150.

The substrate holding section 3 holds the substrate W in a horizontal posture. More specifically, the substrate W has a pattern formation surface portion with a pattern formed therein. The substrate holding section 3 holds the substrate W with the pattern formation surface portion facing upward. As such, the upper surface of the substrate W held by the substrate holding section 3 corresponds to the pattern formation surface portion. The pattern is formed in the surface portion of the substrate W by etching processing, for example. The substrate processing method of the present embodiment is typically for processing a substrate W subjected to dry etching processing. That is, the substrate processing apparatus 100 performs cleaning processing for removing a polymer residue attached to the substrate W after etching processing.

The substrate holding section 3 is a vacuum type spin chuck, for example. However, the substrate holding section 3 is not limited to the vacuum type spin chuck. The substrate holding section 3 may be a pinching type spin chuck or a Bernoulli spin chuck, for example.

The rotary drive section 4 rotates the substrate holding section 3 about a rotation axis AX as a center. This rotates the substrate W and the substrate holding section 3 in a solid manner about the rotation axis AX as a center. The rotation axis AX extends in the vertical direction. The rotary drive section 4 includes an electric motor, for example.

The first nozzle 5 supplies the DHF to the substrate W from above the substrate W. In detail, the first nozzle 5 ejects the DHF toward the rotating substrate W. The first nozzle moving section 50 moves the first nozzle 5 between its processing position and its retraction position. The first nozzle 5 moved to the processing position is opposite to the substrate W in a plan view. The first nozzle 5 moved to the retraction position is not opposite to the substrate W in a plan view. In detail, the first nozzle 5 moved to the processing position is opposite to the central part of the upper surface of the substrate W. By contrast, the first nozzle 5 moved to the retraction position retracts around the substrate W in a plan view.

Specifically, the first nozzle moving section 50 includes a first nozzle arm 51 and a first nozzle drive section 52. The first nozzle arm 51 extends substantially in a horizontal direction. The first nozzle 5 is disposed at the tip end of the first nozzle arm 51. The first nozzle drive section 52 turns the first nozzle arm 51 along a substantially horizontal plane about a rotation axis extending in the vertical direction as a center. As a result, the first nozzle 5 moves in a circular direction about the vertically extending rotation axis as a center. The first nozzle drive section 52 includes an electric motor that rotates forward and backward. The first nozzle drive section 52 is controlled by the controller 101 (control section 102).

The first processing liquid supply section 110 supplies the DHF to the first nozzle 5. Specifically, the first processing liquid supply section 110 includes a first processing liquid supply pipe 111 and a first valve 112. The chamber 2 accommodates a part of the first processing liquid supply pipe 111.

The first processing liquid supply pipe 111 supplies the DHF to the first nozzle 5. The first processing liquid supply pipe 111 is a tubular member through which the DHF flows. The first valve 112 is provided in the first processing liquid supply pipe 111. The first valve 112 is a solenoid valve, for example.

The first valve 112 is an on-off valve that opens and closes the flow channel of the first processing liquid supply pipe 111. The first valve 112 controls the flow of the DHF flowing in the first processing liquid supply pipe 111. In detail, when the first valve 112 is opened, the DHF flows to the first nozzle 5 via the first processing liquid supply pipe 111. As a result, the DHF is ejected from the first nozzle 5. When the first valve 112 is closed, the flow of the DHF is blocked to stop ejection of the DHF from the first nozzle 5. Note that the first valve 112 functions also as a regulating valve for regulating the flow rate of the DHF flowing in the first processing liquid supply pipe 111. The first valve 112 is controlled by the controller 101 (control section 102).

The second nozzle 6 supplies the DIW to the substrate W from above the substrate W. In detail, the second nozzle 6 ejects the DIW toward the rotating substrate W. The second nozzle moving section 60 moves the second nozzle 6 between its processing position and its retraction position likewise the first nozzle moving section 50. Specifically, the second nozzle moving section 60 includes a second nozzle arm 61 and a second nozzle drive section 62 likewise the first nozzle moving section 50. The second nozzle moving section 60 has the same configuration as the first nozzle moving section 50, and therefore, detailed description thereof is omitted.

The second processing liquid supply section 120 supplies the DIW to the second nozzle 6. Specifically, the second processing liquid supply section 120 includes a second processing liquid supply pipe 121 and a second valve 122 likewise the first processing liquid supply section 110. The chamber 2 accommodates a part of the second processing liquid supply pipe 121. The second processing liquid supply pipe 121 supplies the DIW to the second nozzle 6. The second valve 122 is provided in the second processing liquid supply pipe 121. The second processing liquid supply section 120 has the same configuration as the first processing liquid supply section 110, and therefore, detailed description thereof is omitted.

The third nozzle 7 supplies the SC1 to the substrate W from above the substrate W. In detail, the third nozzle 7 ejects the SC1 toward the rotating substrate W. The third nozzle moving section 70 moves the third nozzle 7 between its processing position and its retraction position likewise the first nozzle moving section 50. Specifically, the third nozzle moving section 70 includes a third nozzle arm 71 and a third nozzle drive section 72 likewise the first nozzle moving section 50. The third nozzle moving section 70 has the same configuration as the first nozzle moving section 50, and therefore, detailed description thereof is omitted.

The third processing liquid supply section 130 supplies the SC1 to the third nozzle 7. Specifically, the third processing liquid supply section 130 includes a third processing liquid supply pipe 131 and a third valve 132 likewise the first processing liquid supply section 110. The chamber 2 accommodates a part of the third processing liquid supply pipe 131. The third processing liquid supply pipe 131 supplies the SC1 to the third nozzle 7. The third valve 132 is provided in the third processing liquid supply pipe 131. The third processing liquid supply section 130 has the same configuration as the first processing liquid supply section 110, and therefore, detailed description thereof is omitted.

The fourth nozzle 8 supplies the IPA and the dilute IPA to the substrate W from above the substrate W. In detail, the fourth nozzle 8 ejects the IPA and the dilute IPA toward the rotating substrate W. The dilute IPA is obtained by diluting IPA. In the present embodiment, the dilute IPA is IPA diluted with the DIW. In other words, the dilute IPA is a mixed liquid of the IPA and the DIW. The ratio (content ratio) of the DIW to the IPA is at least 10% and no greater than 30%, for example. In the following, the dilute IPA may be referred to as "dIPA".

The fourth nozzle moving section 80 moves the fourth nozzle 8 between its processing position and its retraction position likewise the first nozzle moving section 50. Specifically, the fourth nozzle moving section 80 includes a fourth nozzle arm 81 and a fourth nozzle drive section 82 likewise the first nozzle moving section 50. The fourth nozzle moving section 80 has the same configuration as the first nozzle moving section 50, and therefore, detailed description thereof is omitted.

The fourth processing liquid supply section 140 supplies the IPA and the dIPA to the fourth nozzle 8. Specifically, the fourth processing liquid supply section 140 includes a fourth processing liquid supply pipe 141, a fourth valve 142, a fifth processing liquid supply pipe 143, and a fifth valve 144. The chamber 2 accommodates a part of the fourth processing liquid supply pipe 141.

The fourth processing liquid supply section 140 supplies the IPA and the dIPA to the fourth nozzle 8. The fifth processing liquid supply pipe 143 supplies the DIW to the fourth processing liquid supply pipe 141. The fourth valve 142 is provided in the fourth processing liquid supply pipe 141. The fifth valve 144 is provided in the fifth processing liquid supply pipe 143. The fourth valve 142 and the fifth valve 144 each are a solenoid valve, for example. The fifth processing liquid supply pipe 143 is connected to the fourth processing liquid supply pipe 141 between the fourth nozzle 8 and the fourth valve 142.

The fourth valve 142 is an on-off valve that opens and closes the flow channel of the fourth processing liquid supply pipe 141. The fourth valve 142 controls the flow of the IPA flowing in the fourth processing liquid supply pipe 141. In detail, when the fourth valve 142 is opened, the IPA flows to the fourth nozzle 8 via the fourth processing liquid supply pipe 141. When the fourth valve 142 is closed, the flow of the IPA is blocked. Note that the fourth valve 142 functions also as a regulating valve that regulates the flow rate of the IPA flowing in the fourth processing liquid supply pipe 141. The fourth valve 142 is controlled by the controller 101 (control section 102).

The fifth valve 144 is an on-off valve that opens and closes the flow channel of the fifth processing liquid supply pipe 143. The fifth valve 144 controls the flow of the DIW flowing in the fifth processing liquid supply pipe 143. In detail, when the fifth valve is opened, the DIW flows into the fourth processing liquid supply pipe 141 via the fifth processing liquid supply pipe 143. When the fifth valve 142 is closed, the flow of the DIW is blocked. Note that the fifth valve 144 functions also as a regulating valve that regulates the flow rate of the DIW flowing in the fifth processing liquid supply pipe 143. The fifth valve 144 is controlled by the controller 101 (control section 102).

The controller 101 (control section 102) opens the fourth valve 142 and closes the fifth valve 144 during ejection of the IPA from the fourth nozzle 8. As a result, the IPA is supplied to the fourth nozzle 8 from the fourth processing liquid supply pipe 141 and ejected from the fourth nozzle 8. When the controller 101 (control section 102) closes the fourth valve 142, the flow channel of the IPA is blocked to stop ejection of the IPA from the fourth nozzle 8.

The controller 101 (control section 102) opens the fourth valve 142 and the fifth valve 144 during ejection of the dIPA from the fourth nozzle 8. As a result, the IPA flowing in the fourth processing liquid supply pipe 141 is merged with the DIW from the fifth processing liquid supply pipe 143 to produce the dIPA. The dIPA is supplied to the fourth nozzle 8 from the fourth processing liquid supply pipe 141. As a result, the dIPA is ejected from the fourth nozzle 8. When the controller 101 (control section 102) closes the fourth valve 142 and the fifth valve 144, the flow channels of the IPA and the DIW are blocked to stop ejection of the dIPA from the fourth nozzle 8.

The fifth nozzle 9 supplies the water repellent agent SMT to the substrate W from above the substrate W. In detail, the fifth nozzle 9 ejects the water repellent agent SMT toward the rotating substrate W. The fifth nozzle moving section 90 moves the fifth nozzle 9 between its processing position and its retraction position likewise the first nozzle moving section 50. Specifically, the fifth nozzle moving section 90 includes a fifth nozzle arm 91 and a fifth nozzle drive section 92 likewise the first nozzle moving section 50. The fifth nozzle moving section 90 has the same configuration as the first nozzle moving section 50, and therefore, detailed description thereof is omitted.

The fifth processing liquid supply section 150 supplies the water repellent agent SMT to the fifth nozzle 9. Specifically, the fifth processing liquid supply section 150 includes a sixth processing liquid supply pipe 151 and a sixth valve 152 likewise the first processing liquid supply section 110. The chamber 2 accommodates a part of the sixth processing liquid supply pipe 151. The sixth processing liquid supply pipe 151 supplies the water repellent agent SMT to the fifth nozzle 9. The sixth valve 152 is provided in the sixth processing liquid supply pipe 151. The fifth processing liquid supply section 150 has the same configuration as the first processing liquid supply section 110, and therefore, detailed description thereof is omitted.

The water repellent agent SMT is a silicon-based water repellent agent or a metal-based water repellent agent, for example. The silicon-based water repellent agent renders silicon or a compound containing silicon water repellent (hydrophobic). The metal-based water repellent agent renders a metal or a compound containing a metal water repellent (hydrophobic).

The silicon-based water repellent agent is a silane coupling agent, for example. The silane coupling agent includes at least one of hexamethyldisilazane (HMDS), tetramethylsilane (TMS), fluorinated alkylchlorosilane, alkyldisilazane, and a non-chloro-based hydrophobizing agent, for example. The non-chloro-based hydrophobizing agent includes at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and an organosilane compound, for example.

The metal-based water repellent agent includes at least one of amine with a hydrophobic group and an organic silicon compound.

The water repellent agent SMT may be diluted with a solvent compatible with a hydrophilic organic solvent. The solvent may be IPA or propylene glycol monomethyl ether acetate (PGMEA), for example.

The water repellent agent SMT forms a water repellent protection film on the upper surface of the substrate W. As a result, the pattern formed in the substrate W is covered with the water repellent protection film. Pattern collapse can be prevented by covering the pattern with the water repellent protection film.

The cup 10 is disposed around the substrate holding section 3. The cup 10 surrounds the side of the substrate W held by the substrate holding section 3. The cup receives the processing liquids (the DHF, the DIW, the SC1, the IPA, the dIPA, and the water repellent agent SMT) scattered from the rotating substrate W.

With reference to FIGS. 1 to 3, the substrate processing method according to the present embodiment will be described next. FIG. 3 is a flowchart depicting the substrate processing method of the present embodiment. The processing depicted in FIG. 3 includes Steps S1 to S7 and Steps S11 to S13.

For processing a substrate W using the substrate processing apparatus 100 described with reference to FIGS. 1 and 2, the center robot CR first transports the substrate W into the chamber 2 of a processing unit 1 (Step S1). The substrate W transported in the chamber 2 is held by the substrate holding section 3. Once the substrate holding section 3 holds the substrate W, rotation of the substrate W by the rotary drive section 4 starts.

When the substrate W starts rotating, the first nozzle 5 moves from the retraction position to the processing position and the DHF is supplied to the substrate W from the first nozzle 5 (Step S2). Specifically, the DHF is ejected toward the substrate W from the first nozzle 5.

The DHF lands on the central part of the upper surface of the substrate W, and then flows outward of the substrate W due to rotation of the substrate W. As a result, a liquid film of the DHF is formed on the upper surface of the substrate W. Once the liquid film of the DHF is formed on the upper surface of the substrate W, ejection of the DHF toward the substrate W from the first nozzle 5 stops. Thereafter, the first nozzle moves from the processing position to the retraction position. The liquid film of the DHF removes a natural oxide film formed on the upper surface of the substrate W.

After the substrate W is processed with the DHF, the second nozzle 6 moves from the retraction position to the processing position and the DIW is supplied to the substrate W from the second nozzle 6 (Step S3). Specifically, the DIW is ejected toward the substrate W from the second nozzle 6.

The DIW lands on the central part of the upper surface of the substrate W, and then flows outward of the substrate W due to rotation of the substrate W. As a result, the liquid film of the DHF is replaced with a liquid film of the DIW. In other words, the DHF remaining on the upper surface of the substrate W is washed away with the DIW (rinsing processing). Once the liquid film of the DIW is formed on the upper surface of the substrate W, ejection of the DIW toward the substrate W from the second nozzle 6 stops. Thereafter, the second nozzle 6 moves from the processing position to the retraction position.

After the rinsing processing with the DIW, the third nozzle 7 moves from the retraction position to the processing position and the SC1 is supplied to the substrate W from the third nozzle 7 (Step S4). Specifically, the SC1 is ejected toward the substrate W from the third nozzle 7.

The SC1 lands on the central part of the upper surface of the substrate W, and then flows outward of the substrate W due to rotation of the substrate W. As a result, the liquid film of the DIW is replaced with a liquid film of the SC1. Once the liquid film of the SC1 is formed on the upper surface of the substrate W, ejection of the SC1 toward the substrate W from the third nozzle 7 stops. Thereafter, the third nozzle 7 moves from the processing position to the retraction position. The liquid film of the SC1 removes a residue of a resist from the upper surface of the substrate W.

After the substrate W is processed with the SC1, the second nozzle 6 moves from the retraction position to the processing position and the DIW is supplied to the substrate W from the second nozzle 6 (Step S5). As a result, the liquid film of the SC1 is replaced with a liquid film of the DIW likewise in Step S3. In other words, the SC1 remaining on the upper surface of the substrate W is washed away with the DIW (rinsing processing).

Once the liquid film of the DIW is formed on the upper surface of the substrate W, ejection of the DIW toward the substrate W from the second nozzle 6 stops. Thereafter, the second nozzle 6 moves from the processing position to the retraction position.

After the substrate W is processed with the DIW, the fourth nozzle 8 moves from the retraction position to the processing position and the IPA is supplied to the substrate W from the fourth nozzle 8 (Step S6). Specifically, the IPA is ejected toward the substrate W from the fourth nozzle 8.

The IPA lands on the central part of the upper surface of the substrate W, and then flows outward of the substrate W due to rotation of the substrate W. As a result, the liquid film of the DIW is replaced with a liquid film of the IPA. Once the liquid film of the IPA is formed on the upper surface of the substrate W, ejection of the IPA toward the substrate W from the fourth nozzle 8 stops. Thereafter, the fourth nozzle 8 moves from the processing position to the retraction position. Supply of the IPA to the substrate W before the water repellent agent SMT is supplied to the substrate W facilitates spreading of the water repellent agent SMT over the entirety of the upper surface of the substrate W.

After the IPA is supplied to the substrate W, the fifth nozzle 9 moves from the retraction position to the processing position and the water repellent agent SMT is supplied to the substrate W from the fifth nozzle 9 (Step S7). Specifically, the water repellent agent SMT is ejected toward the substrate W from the fifth nozzle 9.

The water repellent agent SMT lands on the central part of the upper surface of the substrate W, and then flows outward of the substrate W due to rotation of the substrate W. As a result, the liquid film of the IPA is replaced with a liquid film of the water repellent agent SMT. Once the liquid film of the water repellent agent SMT is formed on the upper surface of the substrate W, ejection of the water repellent agent SMT toward the substrate W from the fifth nozzle 9 stops. Thereafter, the fifth nozzle 9 moves from the processing position to the retraction position. As a result of formation of the liquid film of the water repellent agent SMT on the upper surface of the substrate W, a water repellent protection film is formed on the upper surface of the substrate W and covers the pattern formed in the substrate W (water repellent processing).

After the water repellent processing, the fourth nozzle 8 moves from the retraction position to the processing position and the dIPA is supplied to the substrate W from the fourth nozzle 8 (Step S11). Specifically, the dIPA is ejected toward the substrate W from the fourth nozzle 8.

The dIPA lands on the central part of the upper surface of the substrate W, and then flows outward of the substrate W due to rotation of the substrate W. As a result, a residue of the water repellent agent SMT is removed from the upper surface of the substrate W and a liquid film of the dIPA is formed on the upper surface of the substrate W. In other words, the water repellent agent SMT remaining on the upper surface of the substrate W is washed away with the dIPA (rinsing processing). Once the liquid film of the dIPA is formed on the upper surface of the substrate W, ejection of the dIPA toward the substrate W from the fourth nozzle 8 stops. Thereafter, the fourth nozzle 8 moves from the processing position to the retraction position.

After the rinsing processing with the dIPA, drying processing for drying the substrate W is performed (Step S12). Specifically, the controller 101 (control section 102) controls the rotary drive section 4 to increase the rotational speed of the substrate W. As a result, a large centrifugal force is applied to the liquid attached to the substrate W, thereby shaking off the liquid attached to the substrate W around the substrate W. The substrate W is dried by removing the liquid from the substrate W in the manner described above. Note that the controller 101 (control section 102) stops rotation of the substrate W by the rotary drive section 4 after a specific time elapses from the start of high-speed rotation of the substrate W, for example.

After the drying processing, the center robot CR transports the substrate W out of the chamber 2 (Step S13). As a result, the processing depicted in FIG. 3 ends.

The first embodiment of the present invention has been described so far with reference to FIGS. 1 to 3. According to the present embodiment, the rinsing processing with the dIPA is performed after the water repellent processing. The dIPA has a smaller surface tension than water. Therefore, the dIPA more readily spreads than water over the entirety of the upper surface of the substrate W. Accordingly, cleanness of the substrate W can be increased as a result of removal of the water repellent agent SMT (residue of the water repellent agent SMT) remaining on the upper surface of the substrate W from the entirety of the upper surface of the substrate W. Furthermore, the residue of the water repellent agent SMT easily dissolves in the dIPA due to the dIPA being a high polar liquid. As such, the residue of the water repellent agent SMT can be efficiently removed.

According to the present embodiment, the IPA and the dIPA can be ejected from the fourth nozzle 8. This can eliminate the need of providing a nozzle dedicated for the dIPA in the substrate processing apparatus 100 (processing units 1).

One of liquids that have small surface tension and high polarity is PGMEA. However, in order to perform rinsing processing with the PGMEA after the water repellent processing, it is necessary to provide a dedicated mechanism for supplying the PGMEA to the substrate W in the substrate processing apparatus 100. According to the present embodiment, the rinsing processing after the water repellent processing can be performed without need of providing a dedicated mechanism for supplying a chemical liquid used for the rinsing processing after the water repellent processing in the substrate processing apparatus 100.

According to the present embodiment, the pattern can be covered with the water repellent protection film. Accordingly, the contact angle of a liquid attached to the pattern before the drying processing can be increased. This can reduce the surface tension of the liquid acting on the pattern in the drying processing, thereby preventing pattern collapse.

According to the present embodiment, the rinsing processing with the dIPA is performed after the water repellent processing. Due to the dIPA having a smaller surface tension than water, the surface tension of a liquid acting on the pattern in the drying processing becomes smaller than that in a case in which rinsing processing with water is performed after the water repellent processing. This can further prevent pattern collapse.

Note that although the water repellent agent SMT and the IPA may react to produce a reaction product, the reaction product dissolves in water contained in the dIPA. Therefore, the reaction product produced through reaction of the water repellent agent SMT and the IPA can be removed according to the present embodiment.

Second Embodiment

Next, a second embodiment of the present invention will be described with reference to FIGS. 1, 2, and 4. However, only matter different from that of the first embodiment is described and descriptions of the same matter as that of the first embodiment is omitted. The second embodiment differs from the first embodiment in supply of the IPA to the substrate W after supply of the dIPA to the substrate W.

Figure 4:
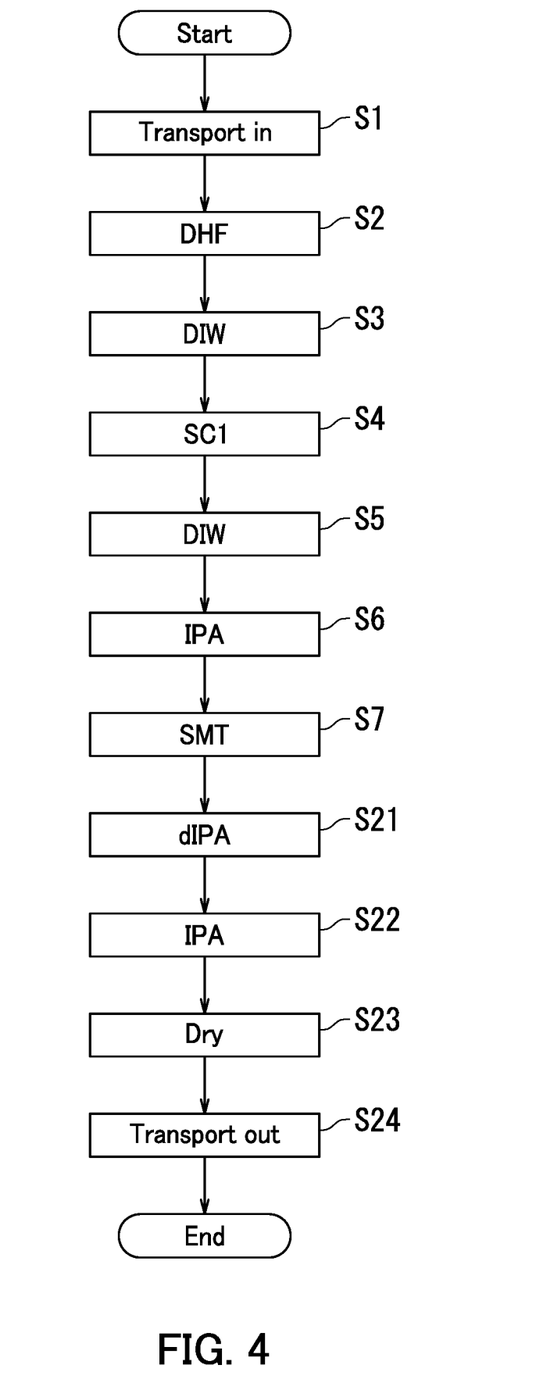
FIG. 4 is a flowchart depicting a substrate processing method according to a second embodiment of the present invention.

FIG. 4 is a flowchart depicting a substrate processing method according to the present embodiment. The processing depicted in FIG. 4 can be implemented by the substrate processing apparatus 100 described with reference to FIGS. 1 and 2 likewise in the first embodiment. The processing depicted in FIG. 4 includes Steps S1 to S7 and S21 to S24. Note that the processes in Steps S1 to S7 depicted in FIG. 4 are the same as those in Steps S1 to S7 depicted in FIG. 3. Therefore, description thereof is omitted.

As depicted in FIG. 4, after the water repellent processing, the fourth nozzle 8 moves from the retraction position to the processing position and the dIPA is supplied to the substrate W from the fourth nozzle 8 (Step S21). Specifically, the dIPA is ejected toward the substrate W from the fourth nozzle 8.

The dIPA lands on the central part of the upper surface of the substrate W, and then flows outward of the substrate W due to rotation of the substrate W. As a result, a residue of the water repellent agent SMT is removed from the upper surface of the substrate W and a liquid film of the dIPA is formed on the upper surface of the substrate W. In other words, the water repellent agent SMT remaining on the upper surface of the substrate W is washed away with the dIPA (rinsing processing).

In the present embodiment, after the liquid film of the dIPA is formed on the upper surface of the substrate W, the IPA is supplied to the substrate W from the fourth nozzle 8 (Step S22). Specifically, the fifth valve 144 is closed, and supply of the DIW to the fourth processing liquid supply pipe 141 from the fifth processing liquid supply pipe 143 stops. As a result, the IPA is ejected toward the substrate W from the fourth nozzle 8.

The IPA lands on the central part of the upper surface of the substrate W, and then flows outward of the substrate W due to rotation of the substrate W. As a result, the liquid film of the dIPA is replaced with a liquid film of the IPA. Once the liquid film of the IPA is formed on the upper surface of the substrate W, ejection of the IPA toward the substrate W from the fourth nozzle 8 stops. Thereafter, the fourth nozzle 8 moves from the processing position to the retraction position. The reaction product produced through reaction of the water repellent agent SMT and the IPA supplied to the substrate W before the water repellent processing is removed from the substrate W together with the dIPA in replacement of the liquid film of the dIPA with the liquid film of the IPA.

After the liquid film of the IPA is formed on the upper surface of the substrate W, the drying processing is performed (Step S23) likewise in Step S12 described with reference to FIG. 3. After the drying processing, the center robot CR transports the substrate W out of the chamber 2 (Step S24). As a result, the processing depicted in FIG. 4 ends.

The second embodiment of the present invention has been described so far with reference to FIGS. 1, 2, and 4. According to the present embodiment, cleanness of the substrate W can be increased likewise in the first embodiment. According to the present embodiment, the upper surface of the substrate W can be covered with the liquid film of the IPA before the drying processing. Due to the IPA having a smaller surface tension than the dIPA, the surface tension of a liquid acting on the pattern in the drying processing becomes further small. This can further prevent pattern collapse.

Third Embodiment

Next, a third embodiment of the present invention will be described with reference to FIGS. 1, 2, and 5. However, only matter different from that of the first and second embodiments is described and descriptions of the same matter as that of the first and second embodiments is omitted. The third embodiment differs from the first embodiment in supply of the IPA to the substrate W before supply of the dIPA to the substrate W.

Figure 5:
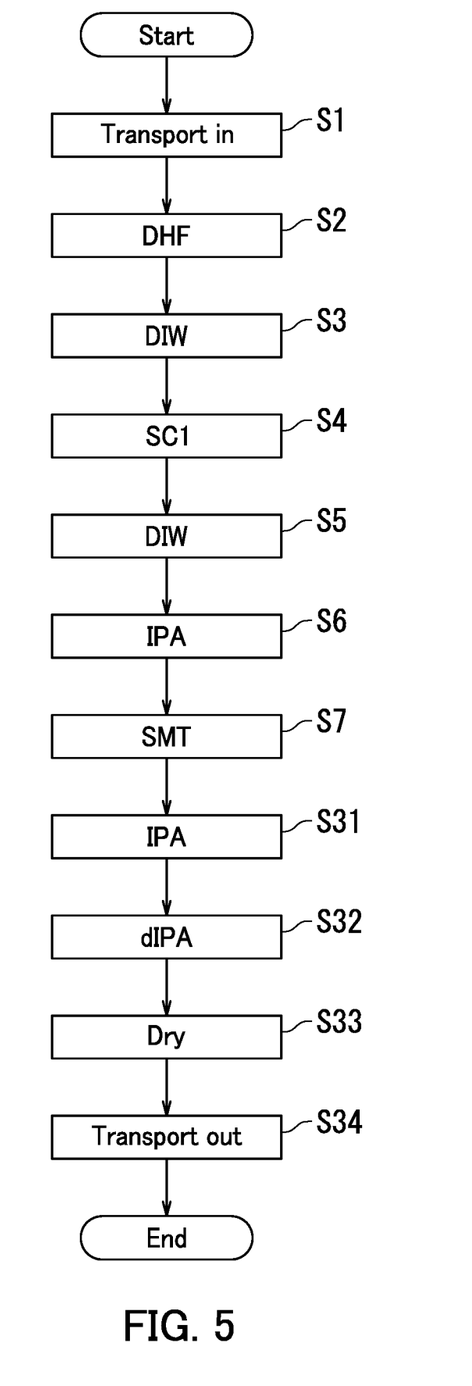
FIG. 5 is a flowchart depicting a substrate processing method according to a third embodiment of the present invention.

FIG. 5 is a flowchart depicting a substrate processing method of the present embodiment. The processing depicted in FIG. 5 can be implemented by the substrate processing apparatus 100 described with reference to FIGS. 1 and 2 likewise in the first and second embodiments. The processing depicted in FIG. 5 includes Steps S1 to S7 and Steps S31 to S34. Note that the processes in Steps S1 to S7 depicted in FIG. 5 are the same as those in Steps S1 to S7 depicted in FIG. 3. Therefore, description thereof is omitted.

As depicted in FIG. 5, after the water repellent processing, the fourth nozzle 8 moves from the retraction position to the processing position and the IPA is supplied to the substrate W from the fourth nozzle 8 (Step S31). Specifically, the IPA is ejected toward the substrate W from the fourth nozzle 8.

The IPA lands on the central part of the upper surface of the substrate W, and then flows outward of the substrate W due to rotation of the substrate W. As a result, a residue of the water repellent agent SMT is removed from the upper surface of the substrate W and a liquid film of the IPA is formed on the upper surface of the substrate W. In other words, the water repellent agent SMT remaining on the upper surface of the substrate W is washed away with the IPA (rinsing processing).

After the rinsing processing with the IPA, the dIPA is supplied to the substrate W from the fourth nozzle 8 (Step S32). Specifically, the fifth valve 144 is opened and the DIW is supplied to the fourth processing liquid supply pipe 141 from the fifth processing liquid supply pipe 143. As a result, the dIPA is ejected toward the substrate W from the fourth nozzle 8.

The dIPA lands on the central part of the upper surface of the substrate W, and then flows outward of the substrate W due to rotation of the substrate W. As a result, the liquid film of the IPA is replaced with a liquid film of the dIPA. Once the liquid film of the dIPA is formed on the upper surface of the substrate W, ejection of the dIPA toward the substrate W from the fourth nozzle 8 stops. Thereafter, the fourth nozzle 8 moves from the processing position to the retraction position.

After the liquid film of the dIPA is formed on the upper surface of the substrate W, the drying processing is performed (Step S33) likewise in Step S12 described with reference to FIG. 3. After the drying processing, the center robot CR transports the substrate W out of the chamber 2 (Step S34). As a result, the processing depicted in FIG. 5 ends.

The third embodiment of the present invention has been described so far with reference to FIGS. 1, 2, and 5. According to the present embodiment, cleanness of the substrate W can be increased likewise in the first embodiment.

According to the present embodiment, the IPA can be supplied to the substrate W before the dIPA is supplied to the substrate W. Due to having a smaller surface tension than the dIPA, the IPA more readily spreads over the entirety of the upper surface of the substrate W than the dIPA. As such, supply of the dIPA to the substrate W after supply of the IPA to the substrate W can make the dIPA easily spread over the entirety of the upper surface of the substrate W.

The reaction product produced through reaction of the water repellent agent SMT and the IPA supplied to the substrate W after the water repellent processing dissolves in the dIPA, and is accordingly removed from the substrate W together with the dIPA in the drying processing.

Fourth Embodiment

Next, a fourth embodiment of the present invention will be described with reference to FIGS. 1, 2, and 6. However, only matter different from that of the first to third embodiments is described and descriptions of the same matter as that of the first to third embodiments is omitted. The fourth embodiment differs from the third embodiment in supply of the IPA to the substrate W after supply of the dIPA to the substrate W.

Figure 6:
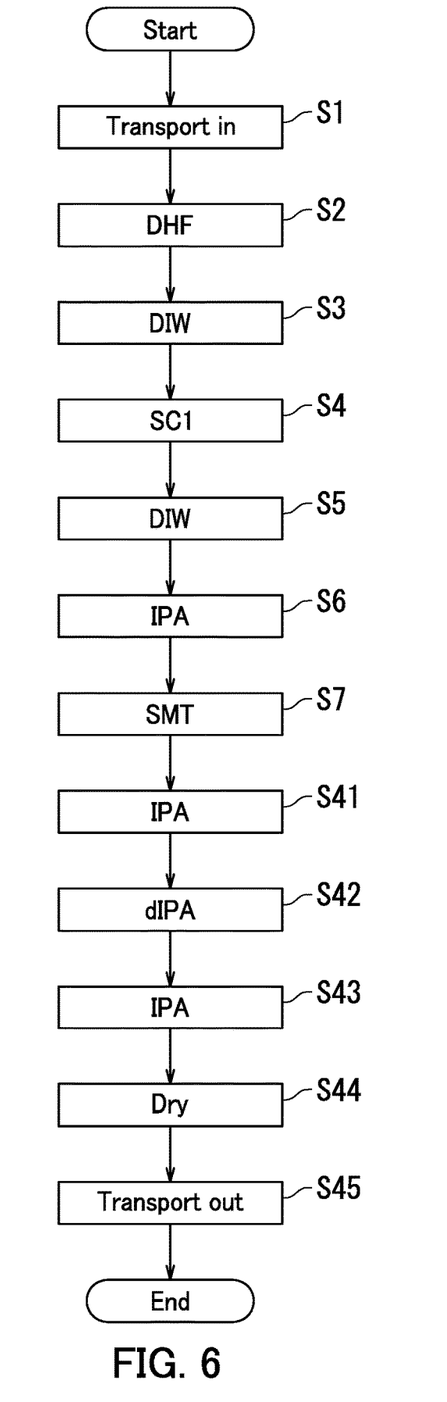
FIG. 6 is a flowchart depicting a substrate processing method according to a fourth embodiment of the present invention.

FIG. 6 is a flowchart depicting a substrate processing method according to the present embodiment. The processing depicted in FIG. 6 can be implemented by the substrate processing apparatus 100 described with reference to FIGS. 1 and 2 likewise in the first to third embodiments. The processing depicted in FIG. 6 includes Steps S1 to S7 and S41 to S45. Note that the processes in Steps S1 to S7 depicted in FIG. 6 are the same as those in Steps S1 to S7 depicted in FIG. 3. Therefore, description thereof is omitted.

As depicted in FIG. 6, after the water repellent processing, the fourth nozzle 8 moves from the retraction position to the processing position and the IPA is supplied to the substrate W from the fourth nozzle 8 (Step S41) likewise in Step S31 described with reference to FIG. 5.

After the rinsing processing with the IPA, the dIPA is supplied to the substrate W from the fourth nozzle 8 (Step S42). Specifically, the fifth valve 144 is opened and the DIW is supplied to the fourth processing liquid supply pipe 141 from the fifth processing liquid supply pipe 143. As a result, the dIPA is ejected toward the substrate W from the fourth nozzle 8.

The dIPA lands on the central part of the upper surface of the substrate W, and then flows outward of the substrate W due to rotation of the substrate W. As a result, the liquid film of the IPA is replaced with a liquid film of the dIPA.

In the present embodiment, after the liquid film of the dIPA is formed on the upper surface of the substrate W, the IPA is supplied to the substrate W from the fourth nozzle 8 (Step S43). Specifically, the fifth valve 144 is closed and supply of the DIW to the fourth processing liquid supply pipe 141 from the fifth processing liquid supply pipe 143 stops. As a result, the IPA is ejected toward the substrate W from the fourth nozzle 8.

The IPA lands on the central part of the upper surface of the substrate W, and then flows outward of the substrate W due to rotation of the substrate W. As a result, the liquid film of the dIPA is replaced with a liquid film of the IPA. Once the liquid film of the IPA is formed on the upper surface of the substrate W, ejection of the IPA toward the substrate W from the fourth nozzle 8 stops. Thereafter, the fourth nozzle 8 moves from the processing position to the retraction position.

After the liquid film of the IPA is formed on the upper surface of the substrate W, the drying processing is performed (Step S44) likewise in Step S12 described with reference to FIG. 3. After the drying processing, the center robot CR transports the substrate W out of the chamber 2 (Step S45). As a result, the processing depicted in FIG. 6 ends.

The fourth embodiment of the present invention has been described so far with reference to FIGS. 1, 2, and 6. According to the present embodiment, cleanness of the substrate W can be increased likewise in the first embodiment. According to the present embodiment, the upper surface of the substrate W can be covered with the liquid film of the IPA before the drying processing. Accordingly, pattern collapse can be further prevented likewise in the second embodiment.

Embodiments of the present invention have been described so far with reference to the drawings (FIGS. 1 to 6). However, the present invention is not limited to the above embodiments and may be implemented in various manners within a scope not departing from the gist thereof. Also, elements of configuration disclosed in the above embodiments can be altered as appropriate. For example, some of all the elements of configuration indicated in an embodiment may be added to the elements of configuration in another embodiment or some of all the elements of configuration indicated in an embodiment may be omitted from the embodiment.

The drawings schematically illustrate elements of configuration in order to facilitate understanding. Properties such as thickness, length, number, and intervals of elements of configuration illustrated in the drawings may differ from actual properties in order to facilitate preparation of the drawings. Furthermore, each element of configuration indicated in the above embodiments is an example and not a particular limitation. Various alterations may be made so long as there is no substantial deviation from the effects of the present invention.

For example, although the IPA is supplied to the substrate W before the water repellent processing in the embodiments described with reference to FIGS. 1 to 6, supply of the IPA before the water repellent processing may be omitted.

Although the processing target is a substrate W after etching processing in the embodiments described with reference to FIGS. 1 to 6, the processing target may be a substrate W after ashing processing.

Although single-wafer cleaning processing for processing substrates W one at a time has been described in the embodiments described with reference to FIGS. 1 to 6, the present invention can be adopted to batch-type cleaning processing that processes substrates W at once.

Although the processing target in the embodiments described with reference to FIGS. 1 to 6 is a substrate W after pattern formation, the present invention can be widely adopted to processing for cleaning a substrate W.

The present invention is useful in a method for processing a substrate.

REFERENCE SINGS LIST

5 First nozzle
6 Second nozzle
7 Third nozzle
8 Fourth nozzle
9 Fifth nozzle
100 Substrate processing apparatus
110 First processing liquid supply section
111 First processing liquid supply pipe
112 First valve
120 Second processing liquid supply section
121 Second processing liquid supply pipe
122 Second valve
130 Third processing liquid supply section
131 Third processing liquid supply pipe
132 Third valve
140 Fourth processing liquid supply section
141 Fourth processing liquid supply pipe
142 Fourth valve
143 Fifth processing liquid supply pipe
144 Fifth valve
150 Fifth processing liquid supply section
151 Sixth processing liquid supply pipe
152 Sixth valve
SMT Water repellent agent
W Substrate

The invention claimed is:

1. A substrate processing method for processing a substrate, comprising:
   supplying a water repellent agent to the substrate;
   supplying dilute isopropyl alcohol to the substrate after supplying the water repellent agent, the dilute isopropyl alcohol being obtained by diluting isopropyl alcohol;
   supplying isopropyl alcohol to the substrate after supplying the dilute isopropyl alcohol; and
   drying the substrate after supplying the isopropyl alcohol; wherein isopropyl alcohol is supplied immediately before the drying, and wherein the dilute isopropyl alcohol includes DIW (deionized water) and isopropyl alcohol, and wherein the ratio of the DIW to the isopropyl alcohol is at least 10% and no greater than 30%.

2. The substrate processing method according to claim 1, further comprising
   supplying isopropyl alcohol to the substrate after supplying the water repellent agent.

3. The substrate processing method according to claim 1, further comprising
   supplying isopropyl alcohol to the substrate after supplying the water repellent agent and before supplying the dilute isopropyl alcohol.

4. The substrate processing method according to claim 2, further comprising
   supplying isopropyl alcohol to the substrate after supplying the water repellent agent and before supplying the dilute isopropyl alcohol.

* * * * *